(12) United States Patent
Geiss et al.

(10) Patent No.: US 7,601,641 B1
(45) Date of Patent: Oct. 13, 2009

(54) TWO STEP OPTICAL PLANARIZING LAYER ETCH

(75) Inventors: Erik Geiss, Wappingers Falls, NY (US); Christopher Prindle, Poughkeepsie, NY (US); Sven Beyer, Dresden (DE)

(73) Assignee: Global Foundries, Inc., Grand Cayman (KY)

( * ) Notice: Subject to any disclaimer, the term of this patent is extended or adjusted under 35 U.S.C. 154(b) by 0 days.

(21) Appl. No.: 12/059,888

(22) Filed: Mar. 31, 2008

(51) Int. Cl.
*H01L 21/302* (2006.01)

(52) U.S. Cl. .................. 438/689; 438/626; 438/638; 438/688; 438/700; 438/706; 438/736; 257/E21.252; 257/E21.256

(58) Field of Classification Search .................. 438/621, 438/709, 733
See application file for complete search history.

(56) References Cited

U.S. PATENT DOCUMENTS

2003/0181054 A1* 9/2003 Lee et al. .................... 438/709

* cited by examiner

*Primary Examiner*—N Drew Richards
*Assistant Examiner*—Kyoung Lee
(74) *Attorney, Agent, or Firm*—Ingrassia, Fisher & Lorenz, P.C.

(57) ABSTRACT

Methods are provided for etching during fabrication of a semiconductor device. The method includes initially etching to partially remove a portion of one or more lithographic-aiding layers overlying an oxide layer while etching a first portion of the oxide layer in accordance with a mask formed by the one or more lithographic-aiding layers, and thereafter additionally etching to remove remaining portions of the one or more lithographic-aiding layers while etching a remaining portion of the oxide layer.

18 Claims, 4 Drawing Sheets

US 7,601,641 B1

TWO STEP OPTICAL PLANARIZING LAYER ETCH

FIELD OF THE INVENTION

The present invention generally relates to semiconductor fabrication etch process methodology, and more particularly relates to a two step Optical Planarizing Layer (OPL) etch process methodology.

BACKGROUND OF THE INVENTION

The transition to 45 nm semiconductor fabrication technology has seen the adoption of immersion lithography for critical levels. Only immersion lithography is capable of providing the resolution to resolve the minimum pitch features at such critical levels. Immersion lithography's resolution enhancement is driven by the utilization of a higher numerical aperture lens (N.A.) which, however, results in a degradation of a depth of focus process window. This depth of focus process window can be recovered by tuning the mask stack to minimize reflectivity. Typically, a tri-layer mask stack consisting of a layer of photoresist, a silicon containing anti-reflective coating (SiARC), and an optical planarizing underlayer (OPL) is utilized to enable immersion lithography with the higher N.A. lens while minimizing reflectivity. A successful transfer of pattern thru the tri-layer mask and underlying oxide/nitride stack and subsequent need to shrink feature size critical dimensions (CD) presents a number of unique challenges for semiconductor fabrication etch. These challenges include the difficulty in maintaining CD retention thru the OPL layer and subsequent over-etch owing to isotropic characteristics during over-etch. Failure to remove the Si infused portions of the mask during the oxide etch will dictate the use of an aggressive or non-selective ASH chemistry which will subsequently lead to an attack of the exposed nitride protecting the active areas which increases the likelihood of premature exposure of the underlying NiSi to the ASH chemistry.

Accordingly, it is desirable to provide an etch process methodology which strikes a careful balance between detuning the oxide etch for mask consumption and selectivity to the mask to maintain pattern fidelity and effectively removing the remaining silicon infused polymer mask. In addition, it is desirable to provide an etch process methodology which allows for CD retention during the OPL over-etch while simultaneously enabling a partial removal of the SiARC mask to allow the use of non-aggressive ASH conditions for minimizing nitride loss. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method is provided for etching during fabrication of a semiconductor device. The method includes initially etching to partially remove a portion of one or more lithographic-aiding layers overlying an oxide layer while etching a first portion of the oxide layer in accordance with a mask formed by the one or more lithographic-aiding layers. Thereafter additional etching is performed to remove remaining portions of the one or more lithographic-aiding layers while etching a remaining portion of the oxide layer.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
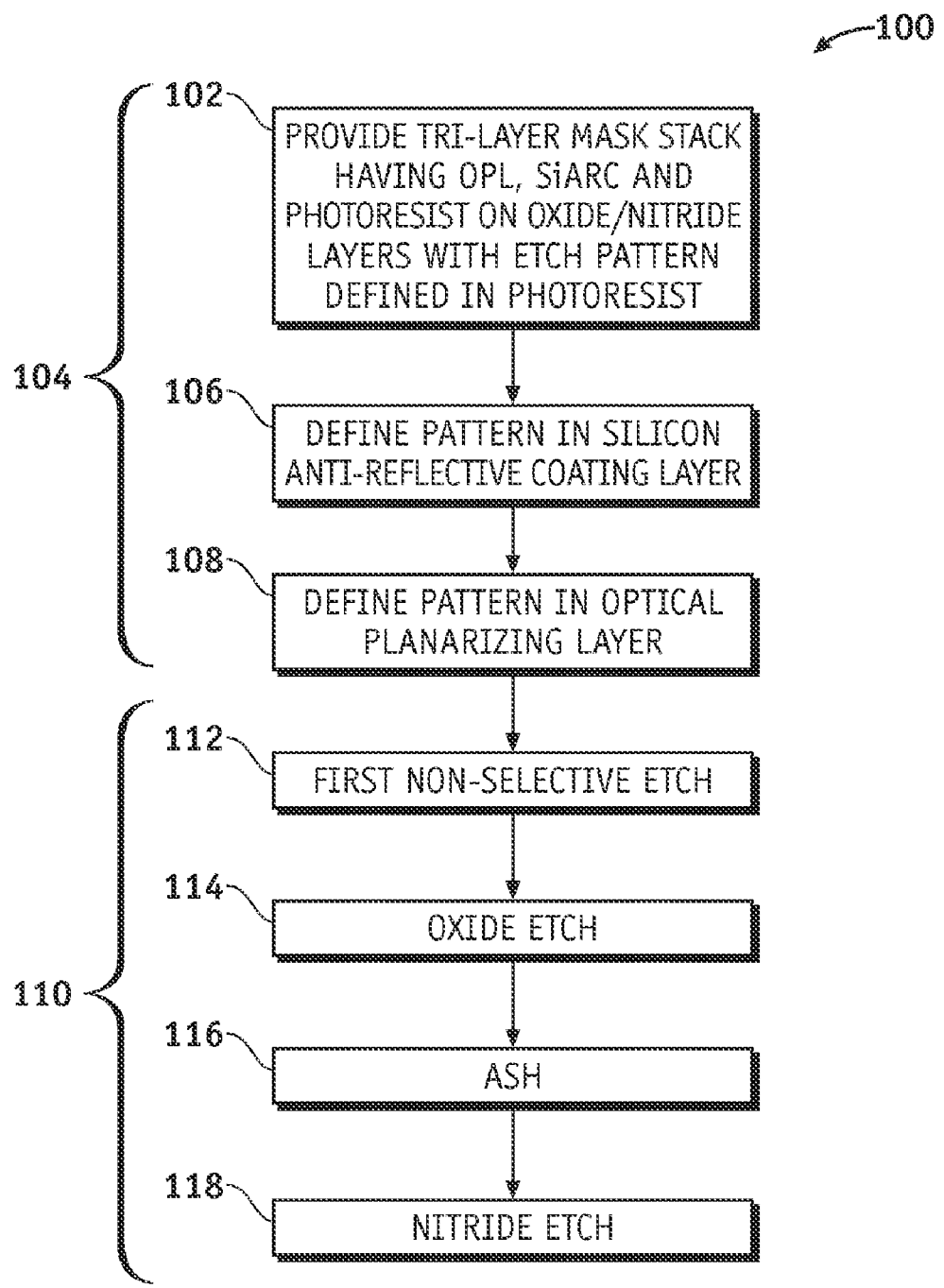
FIG. 1 is a flow diagram of an etch process portion of the fabrication process of a semiconductor device in accordance with a preferred embodiment.

Referring to FIG. 1, a flow diagram 100 of a portion of the fabrication process of a semiconductor device in accordance with a preferred embodiment depicts a fabrication etch process methodology utilizing a tri-layer mask stack for patterning semiconductor device structures, the tri-layer mask stack particularly suitable for formation of semiconductor device structures having reduced critical dimensions, such as critical dimensions equal to or less than forty-five nanometers (45 nm). At such small critical dimensions, conventional lithography cannot be used to pattern the mask. Typically, advanced lithography techniques such as immersion lithography and lithographically providing light at oblique angles is utilized to obtain structures which include critical dimensions of 45 nm or less.

In accordance with such advanced lithography techniques, three lithographic-aiding layers are provided 102 in the tri-layer mask stack overlying an oxide layer. The tri-layer mask comprises an Optical Planarizing Layer (OPL) overlying oxide/nitride stacked layers in which the semiconductor device structures are to be patterned, a silicon anti-reflective coating (SiARC) layer overlying the OPL, and a photoresist overlying the SiARC layer. The tri-layer mask may be provided for patterning the oxide/nitride stacked layers to form a via contact through the oxide/nitride stacked layers to a conductive layer of, for example, silicon underlying the oxide/nitride stacked layers, wherein the OPL layer is formed at a predetermined thickness to provide reflectivity and topography control during etching of the oxide layer. For a 45 nm semiconductor device, the nitride layer overlying the silicon may be approximately seventy nanometers (70 nm) and the oxide layer overlying the nitride layer may be approximately three hundred and seventy nanometers (370 nm). Within the three lithographic-aiding layers, the photoresist layer is typically approximately the same thickness as the OPL (e.g., approximately two hundred nanometers (200 nm)), while the SiARC layer is typically less than half the thickness of the OPL (e.g., approximately eighty nanometers (80 nm)).

Figure 2:
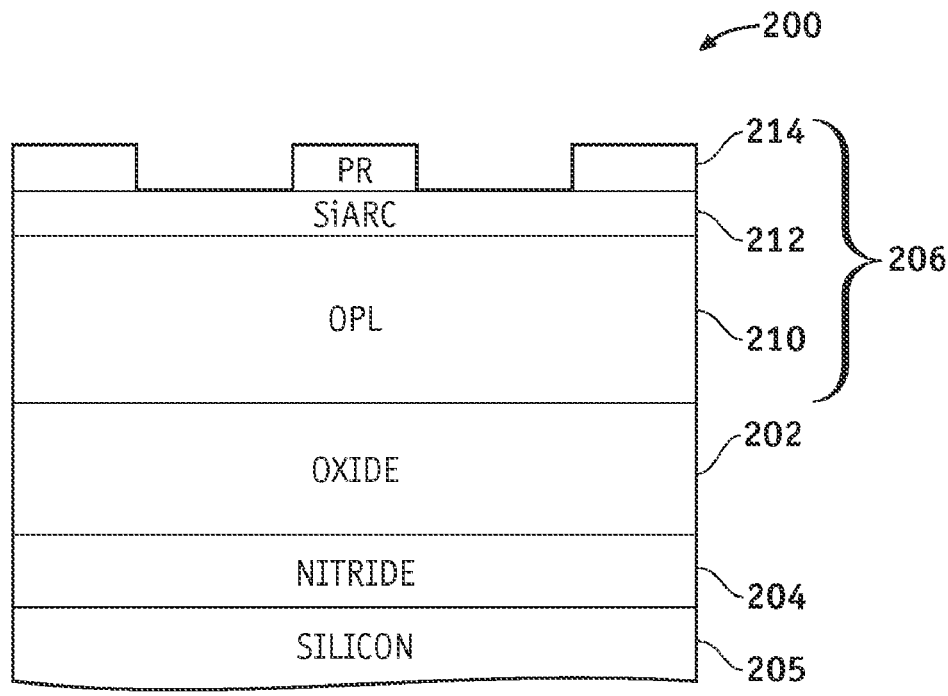
FIG. 2 is a cross-section of a portion of a structure at a first step during the etch process of the semiconductor device in accordance with the preferred embodiment.

The tri-layer mask stack defines a pattern for the immersion lithography by patterning 104 each of the lithographic-aiding layers. Initially, the pattern is defined in the photoresist layer of the tri-layer mask provided at step 102. Referring to FIG. 2, a cross-section of a portion 200 of a semiconductor device structure at step 102 during fabrication of the semiconductor device having reduced critical dimensions of 45 nm or less in accordance with the preferred embodiment includes the oxide layer 202 overlying the nitride layer 204, wherein the nitride layer is formed on the silicon 205. The three lithographic-aiding layers 206 are utilized for reflectivity at such reduced critical dimensions where hyper numerical aperture (NA) lithographic techniques are required, such hyper NA lithographic techniques including immersion lithography.

Figure 3:
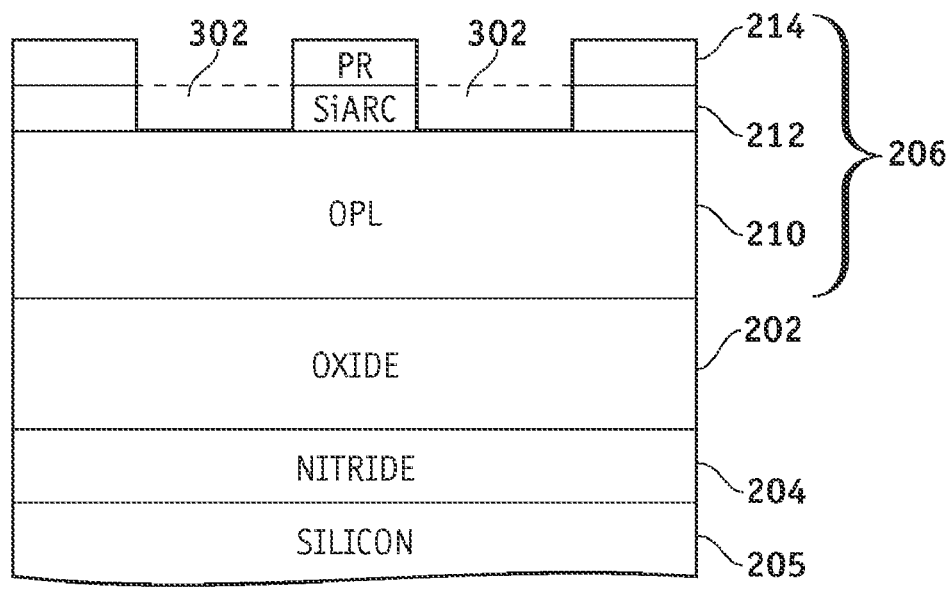
FIG. 3 is a cross-section of the portion of the structure at a second step during the etch process of the semiconductor device in accordance with the preferred embodiment.

The three lithographic-aiding layers 206 include: the OPL 210 overlying the oxide layer, the SiARC layer 212 overlying the OPL 210, and the photoresist layer 214 overlying the SiARC layer 212. At step 102 of the fabrication flow 100 of FIG. 1, the semiconductor is provided with the pattern defined in the photoresist layer 214. Subsequently, the pattern is defined 106 in the SiARC layer 212. Referring to FIG. 3, portions 302 of the SiARC layer 212 are lithographically removed in accordance with the pattern in the photoresist layer 214 as an intermediary step to forming a pattern for etching the oxide layer 202.

Figure 4:
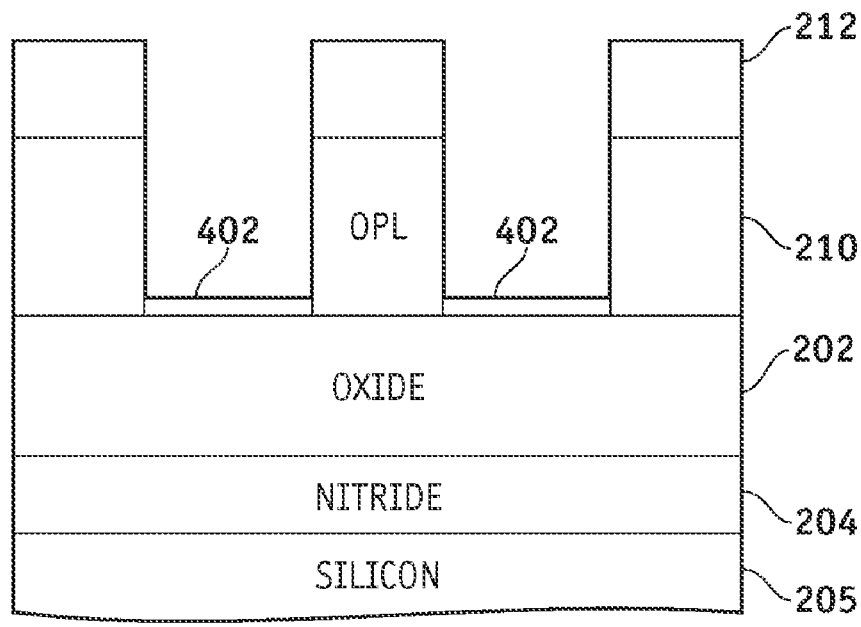
FIG. 4 is a cross-section of the portion of the structure at a third step during the etch process of the semiconductor device in accordance with the preferred embodiment.

In FIG. 1 at step 108, the tri-layer mask is completed by defining the pattern in the OPL 210. Referring to FIG. 4, the pattern has been defined in the OPL 210 and the photoresist layer 214 has been removed. In accordance with the present embodiment, it is not necessary to over-etch the OPL layer 210 to define the pattern at step 126, and, as can be seen in FIG. 4, a portion 402 of the OPL 210 may remain in the etched well without impairing the subsequent etch of the oxide layer 202. Prior art techniques typically required over-etching of the OPL in order to assure that the oxide was exposed in all of the OPL wells, disadvantageously broadening the well openings resulting in a defined dimension greater than the targeted dimension. Thus it can be seen that the preferred embodiment provides greater reliability at smaller critical dimensions by avoiding OPL over-etch.

Figure 5:
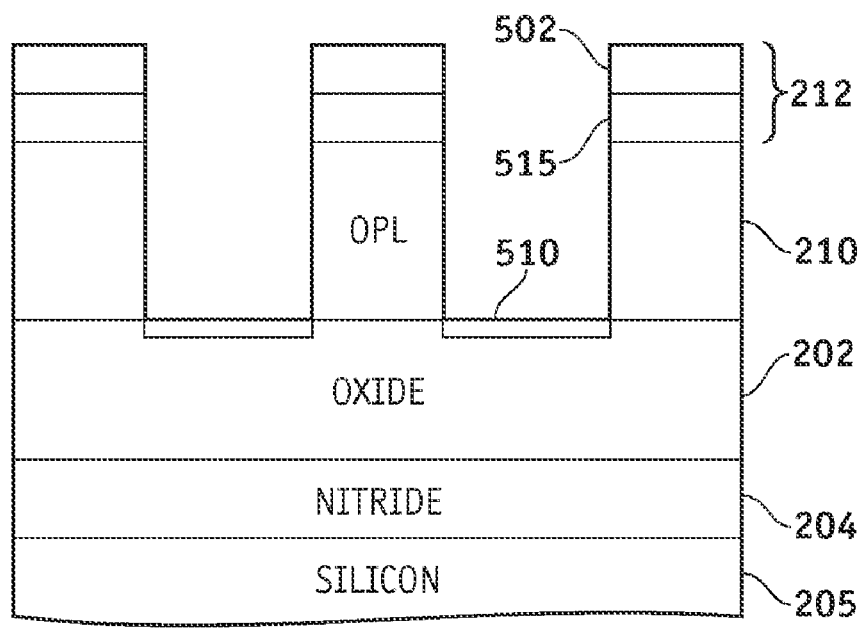
FIG. 5 is a cross-section of the portion of the structure at a fourth step during the etch process of the semiconductor device in accordance with the preferred embodiment.

Referring back to FIG. 1, the preferred embodiment provides a novel oxide/nitride etch 110 comprising a first non-selective etching step 112, an oxide etch step 114, a second etching step 116, and a nitride etch step 118. FIG. 5 depicts a cross section of the semiconductor device at step 140 where the first non-selective etch at step 112 (FIG. 1) removes a first portion 502 of the SiARC layer 212 and a first portion 510 of the oxide layer 202. If there was any remaining portion 402 of the OPL 210 in the mask-defined wells, these would also be removed during the first non-selective etch step thereby providing over-etch of the OPL 210.

A portion 515 of the SiARC remains after the first non-selective etch step 112 facilitating critical dimension retention during the oxide etch step 114. Partial SiARC layer 502 removal with OPL over etch into the oxide layer removing oxide portion 510 provides a marked improvement over prior art tri-layer mask oxide etch techniques because the partial etch does not require selective etching and does not require an aggressive ash etch. Prior art tri-layer mask one-step oxide etch techniques typically remove the SiARC layer and infuses silicon from the SiARC layer into the OPL, necessitating an aggressive ash etching to remove the silicon-infused OPL. Such aggressive ash etching, which typically uses an oxygen based ash chemistry, gouges through the oxide layer into the nitride layer and increases the likelihood of premature exposure of the nitride layer or silicon doped portions thereof to the ash chemistry. Use of the oxygen based ash chemistry also increases the likelihood of oxidization as well as increases defects in low-k nitride layers.

Figure 6:
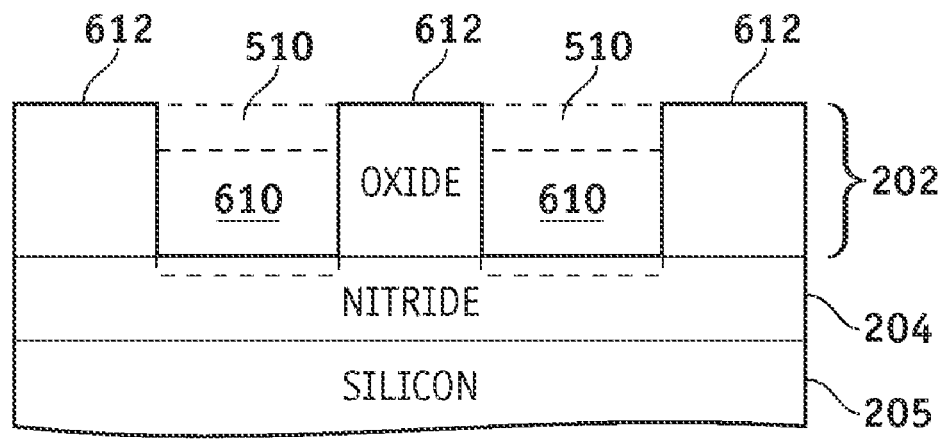
FIG. 6 is a cross-section of the portion of the structure at a fifth step during the etch process of the semiconductor device in accordance with the preferred embodiment.

As shown in FIG. 6, the oxide etch step 114 (FIG. 1) etches a remaining portion 610 of the oxide layer 202 to form the oxide columns 612 and the second non-selective etch step 116 (FIG. 1) in accordance with the preferred embodiment removes the remaining portions 515 of the SiARC layer 212 and the OPL 210 using an anisotropic non-selective etching material. The anisotropic non-selective etching material can be an organic ash or a nitrogen- or hydrogen-based chemistry including, for example, nitrogen gas or hydrogen gas, or a combination thereof. The oxide etch step 114 and the second non-selective etch step 116 opens the oxide layer 202 and removes all of the OPL 210 with little or no gouging of the underlying nitride layer 204.

Figure 7:
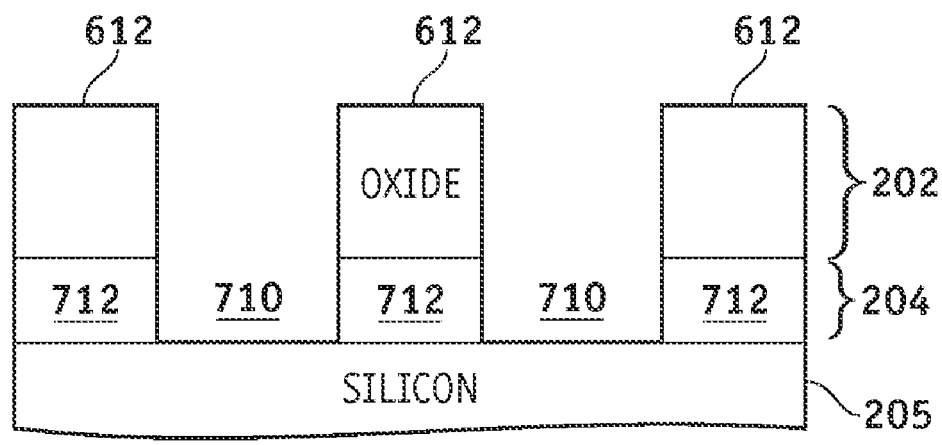
FIG. 7 is a cross-section of the portion of the structure at a sixth step during the etch process of the semiconductor device in accordance with the preferred embodiment.

As shown in FIG. 7, the nitride etch step 118 (FIG. 1) etches a remaining portion 710 of the nitride layer 204 to form the oxide/nitride columns 612/712 in accordance with the preferred embodiment. The conventional nitride etch step 118 opens the oxide layer 202 and the nitride layer 204. After opening the oxide layer 202 and the nitride layer 204 and removal of the tri-layer mask 206 using the oxide etch methodology 110 (FIG. 1) in accordance with the preferred embodiment, a contact can be formed in the oxide/nitride openings to provide contact vias through the oxide layer 202 and the nitride layer 204 to the silicon layer 105 underneath the nitride layer 204.

Thus, it can be seen that a method for etch process methodology has been provided in accordance with the preferred embodiment disclosed hereinabove which removes the necessity for over-etching the OPL 210 and allows a less aggressive ash chemistry for removal of the SiARC mask layer 212. Accordingly, the present embodiment provides an etch methodology which advantageously provides improved critical dimension (CD) retention through CD shrinks by over-etching the OPL 210 and gouging into the underlying oxide layer 202 during a first non-selective etch step 140, thereby increasing yield by reducing the number of shorts or open circuits. In addition, partial removal of the SiARC layer 212 with formation of openings in the OPL 210 enables the use of non-aggressive ash chemistry for removal of remaining portions of the OPL 210 at step 150 after oxide etch at step 145, thereby minimizing nitride loss and nitride gouging. Subsequently, the etch process methodology in accordance with the present embodiment strikes a careful balance between detuning the oxide etch for consumption of the tri-layer mask stack and selectivity to the mask stack, thereby maintaining pattern fidelity while effectively removing the remaining silicon infused polymer mask.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for etching during fabrication of a semiconductor device comprising the steps of:
   initially etching to partially remove a portion of one or more lithographic-aiding layers overlying an oxide layer while etching a first portion of the oxide layer in accordance with a mask formed by the one or more lithographic-aiding layers, the one or more lithographic aiding layers including an anti-reflective coating layer and the step of initially etching comprising the step of non-selectively etching to partially remove a first portion of the anti-reflective coating layer while etching the first portion of the oxide layer; and
   thereafter additionally etching to remove remaining portions of the one or more lithographic-aiding layers after etching a remaining portion of the oxide layer, wherein the one or more lithographic aiding layers further include an optical planarizing layer underlying the anti-reflective coating layer, and wherein the step of additionally etching comprises the step of additionally etching to remove the optical planarizing layer after etching the remaining portion of the oxide layer.

2. The method in accordance with claim 1 wherein the step of additionally etching comprises the step of additionally etching to remove a remaining portion of the anti-reflective coating layer and the optical planarizing layer.

3. The method in accordance with claim 2 wherein the step of additionally etching comprises the step of etching to remove the remaining portion of the anti-reflective coating layer and the optical planarizing layer after etching through the remaining portion of the oxide layer in accordance with the mask formed by the one or more lithographic-aiding layers.

4. A method for etching during fabrication of a semiconductor device comprising the steps of:
   initially etching to partially remove a portion of one or more lithographic-aiding layers overlying an oxide layer while etching a first portion of the oxide layer in accordance with a mask formed by the one or more lithographic-aiding layers; and
   thereafter additionally etching with an anisotropic non-selective etching material to remove remaining portions of the one or more lithographic-aiding layers after etching a remaining portion of the oxide layer.

5. The method in accordance with claim 4 wherein the step of etching with an anisotropic non-selective etching material comprises the step of etching with an organic ash.

6. The method in accordance with claim 4 wherein the step of etching with an anisotropic non-selective etching material comprises the step of etching with either nitrogen gas or hydrogen gas.

7. A method for etching portions of an oxide layer in accordance with a mask during fabrication of a semiconductor device, the method comprising the steps of:
   depositing an optical planarizing layer over the oxide layer;
   depositing an anti-reflective coating layer over the optical planarizing layer;
   depositing a photoresist layer for forming the mask;
   lithographically defining the mask by removing portions of the photoresist layer, the anti-reflective coating layer and the optical planarizing layer in accordance with the mask to allow etching of the oxide layer in accordance with the mask;
   non-selectively etching to partially remove the photoresist layer and a first portion of the anti-reflective coating layer while etching a first portion of the oxide layer in accordance with the mask;
   thereafter, etching a remaining portion of the oxide layer; and
   non-selectively etching to remove a remaining portion of the optical planarizing layer after etching a remaining portion of the oxide layer.

8. The method in accordance with claim 7 wherein the anti-reflective coating layer is a silicon anti-reflective coating layer.

9. The method in accordance with claim 7 wherein the oxide layer is formed overlying a nitride layer, and wherein the step of etching the remaining portion of the oxide layer comprises the step of etching to remove the remaining portion of the oxide layer through to the nitride layer while etching the remaining portion of the anti-reflective coating layer and a portion of the optical planarizing layer.

10. The method in accordance with claim 7 wherein the second step of non-selectively etching comprises the step of etching with an anisotropic non-selective etching material to remove a remaining portion of the optical planarizing layer.

11. The method in accordance with claim 10 wherein the step of etching with an anisotropic non-selective etching material comprises the step of etching with an organic ash to remove the remaining portion of the optical planarizing layer.

12. The method in accordance with claim 10 wherein the step of etching with an anisotropic non-selective etching material comprises the step of etching with either nitrogen gas or hydrogen gas to remove the remaining portion of the optical planarizing layer.

13. A method for lithographic etching during semiconductor fabrication of semiconductor device structures having critical dimensions substantially equal to or less than forty-five nanometers (45 nm), the method comprising the steps of:
   depositing an optical planarizing layer to a thickness of approximately two hundred nanometers overlying an oxide layer;
   depositing an anti-reflective coating layer to a thickness of approximately eighty nanometers overlying the optical planarizing layer;
   depositing a photoresist layer for forming the mask overlying the anti-reflective coating layer;
   defining the mask by immersion lithography to remove portions of the photoresist layer, the anti-reflective coating layer and the optical planarizing layer in accordance with the mask for subsequent etching of the oxide layer in accordance with the mask;
   non-selectively etching to partially remove the photoresist layer and a first portion of the anti-reflective coating layer while etching a first portion of the oxide layer in accordance with the mask;
   thereafter etching a remaining portion of the oxide layer while etching a remaining portion of the anti-reflective coating layer and a portion of the optical planarizing layer; and
   non-selectively etching to remove a remaining portion of the optical planarizing layer.

14. The method in accordance with claim 13 wherein the anti-reflective coating layer is a silicon anti-reflective coating layer.

15. The method in accordance with claim 13 wherein the oxide layer is formed overlying a nitride layer, and wherein the step of etching the remaining portion of the oxide layer comprises the step of etching to remove the remaining portion of the oxide layer through to the nitride layer while etching to remove the remaining portion of the anti-reflective coating layer and the portion of the optical planarizing layer.

16. The method in accordance with claim 13 wherein the second step of non-selectively etching comprises the step of etching with an anisotropic non-selective etching material to remove the remaining portion of the optical planarizing layer.

17. The method in accordance with claim 16 wherein the step of etching with an anisotropic non-selective etching material comprises the step of non-aggressively etching with an organic ash to remove the remaining portion of the optical planarizing layer.

18. The method in accordance with claim 16 wherein the step of etching with an anisotropic non-selective etching material comprises the step of non-aggressively etching with either nitrogen gas or hydrogen gas to remove the remaining portion of the optical planarizing layer.

* * * * *